(12) United States Patent
Gu

(10) Patent No.: US 6,498,045 B1
(45) Date of Patent: Dec. 24, 2002

(54) OPTICAL INTENSITY MODIFIER

(75) Inventor: Shiqun Gu, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/878,741

(22) Filed: Jun. 11, 2001

(51) Int. Cl.$^7$ ............................................... H01L 21/00
(52) U.S. Cl. ........................ 438/9; 216/60; 156/345.25; 438/710
(58) Field of Search ................................ 438/8, 9, 710; 216/59, 60, 67; 156/345 MY

(56) References Cited

U.S. PATENT DOCUMENTS 5,739,051 A * 4/1998 Saito .......................... 438/9 X
6,068,783 A * 5/2000 Szetsen ...................... 438/9 X
6,238,937 B1 * 5/2001 Toprac et al. .................. 438/9

* cited by examiner

Primary Examiner—William A. Powell
(74) Attorney, Agent, or Firm—Luedeka, Neely & Graham,PC

(57) ABSTRACT

A method for detecting an end point of an etching step conducted in an etching chamber. A target emission intensity level is selected for the etching step, and the etching step is performed in the etching chamber. A raw emission intensity level is sensed from the etching chamber during the etching step with an emission intensity level detector. The raw emission intensity level sensed from the etching chamber by the emission detector is modified with an emission intensity level modifier. The raw emission intensity level sensed with the emission intensity level detector from the etching chamber during the etching step is adjusted to the target emission intensity level by adjusting the emission intensity level modifier. The etching process is stopped upon occurrence of a predetermined spectral event sensed by the emission intensity level detector.

20 Claims, 3 Drawing Sheets

OPTICAL INTENSITY MODIFIER

FIELD

The invention relates generally to the art of integrated circuit processing, and in particular to etching integrated circuit substrates.

BACKGROUND

Integrated circuits, such as semiconductor devices, are conventionally fabricated using a variety of well known processing techniques including sputtering, plasma etching, reactive ion etching, and the like. During the integrated circuit fabrication process, a variety of layers of insulating materials, passivating materials and metals are deposited on a substrate. The layers are patterned to provide the desired electrical circuits, conductors, and the like by selectively removing portions of one or more of the layers. Plasma processing, including sputtering, etching and ashing is a well-established and accepted technology employed in the fabrication of integrated circuits. A plasma etch process typically involves a plasma of gases applied to the substrate in a plasma chamber. Masking materials may be applied to portions of the substrate to protect such portions from the plasma gases while portions exposed to the plasma gases are etched. In other words, the plasma gases may be selected to preferentially etch one or more of the exposed layers over others of the exposed layers.

During the plasma processing step, atomic and molecular species are present in the plasma chamber. These species are derived from the plasma gases and the decomposition products from the etching process. The gaseous atomic and molecular species present in the plasma chamber produce radiative emissions that are characteristic of the particular species present in the chamber. Spectral analysis of the emissions may be used to identify the atomic and molecular species present in the plasma chamber, thereby indicating the progress of the etching process. A plot of optical emission intensity may be used to detect the end point of an etching step. Accordingly, the end point of an etching step may be indicated by a sudden increase or decrease in a particular spectral emission or a sudden change in slope of the emission intensity over time. These events tend to relate to a point in time when the last traces of a layer being etched are removed and the underlying layer is exposed to the etching plasma. End point detection thus tends to be an important control parameter for successful plasma etching.

One problem associated with the use of spectral emissions is that the intensity of the emissions is affected by a variety of factors including an increase over time of decomposition products and other materials on the chamber window through which the spectral emissions are monitored. Then another change occurs when the chamber window is cleaned of the deposits. Furthermore, the sensitivity of the different photo detectors used for different plasma chambers may vary from unit to unit and from chamber to chamber. Also, the absolute intensity of the emissions detected by photo detectors for multiple plasma chambers and used by a host computer may not be stable or may be difficult to match from chamber to chamber. Accordingly, there is a need for improved methods and apparatus for processing integrated circuits.

SUMMARY

The above and other needs are met by a method for detecting an end point of an etching step conducted in an etching chamber. A target emission intensity level is selected for the etching step, and the etching step is performed in the etching chamber. A raw emission intensity level is sensed from the etching chamber during the etching step with an emission intensity level detector. The raw emission intensity level sensed from the etching chamber by the emission detector is modified with an emission intensity level modifier. The raw emission intensity level sensed with the emission intensity level detector from the etching chamber during the etching step is adjusted to the target emission intensity level by adjusting the emission intensity level modifier. The etching process is stopped upon occurrence of a predetermined spectral event sensed by the emission intensity level detector.

By using the emission intensity level modifier to set the sensed raw emission intensity level to a target emission intensity level at the beginning of each etching process, a baseline is created whereby the differences between emission intensity level sensors, cleanliness of an etching chamber over time, and variations between different etching chambers can be substantially removed from consideration in determining the end point of the etching process conducted in the various etching chambers.

In a preferred embodiment, the step of selecting a target emission intensity level for the etching step is accomplished by sensing a raw emission intensity level for a plurality of etching chambers. The lowest raw emission intensity level sensed from the plurality of etching chambers is determined and multiplied by an intensity factor to produce a result. The result is selected as the target emission intensity level for the etching step in each of the plurality of etching chambers.

In the most preferred embodiments, the intensity factor is less than one, and the step of sensing a raw emission intensity level for the plurality of etching chambers is performed after each of the plurality of etching chambers has been used for a complete duty cycle, and just prior to a scheduled cleaning. Further, the emission intensity level modifier is preferably a graduated neutral density filter.

In an another aspect, the invention provides an etcher having an etching chamber for etching a substrate with an etching process. An emission intensity level detector detects emissions generated while etching the substrate. An emission intensity level modifier modifies the emissions detected by the emission intensity level detector, and substantially maintains a target emission intensity level at an onset of the etching process. An analyzer stops the etching process upon occurrence of a predetermined spectral event sensed by the emission intensity level detector through the emission intensity level modifier.

In yet another aspect, the invention provides an end point detector for detecting an end point of an etching process of a substrate that is conducted in an etching chamber. An emission intensity level detector detects emissions generated while etching the substrate during the etching process. An emission intensity level modifier modifies the emissions detected by the emission intensity level detector, and substantially maintains a target emission intensity level at an onset of the etching process. An analyzer stops the etching process upon occurrence of a predetermined spectral event sensed by the emission intensity level detector through the emission intensity level modifier.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

In the preferred embodiment of the invention, optical emissions are used to determine when a layer on a substrate has been substantially completely etched and an underlying layer is exposed to the etching process, such as to a plasma. For example, a sudden change in emission intensity level at a wavelength of about 310 nanometers tends to indicate a change in the amount of carbon monoxide in a plasma. As carbon monoxide is a common byproduct formed from an organic compound, such as a photoresist layer, in an oxygen plasma, an spectra event such as appreciable decrease in the emission intensity level at this wavelength tends to indicate that a layer of photoresist has been substantially removed in a plasma ashing process. A change of this sort is graphically depicted as in FIG. 1.

Figure 1:
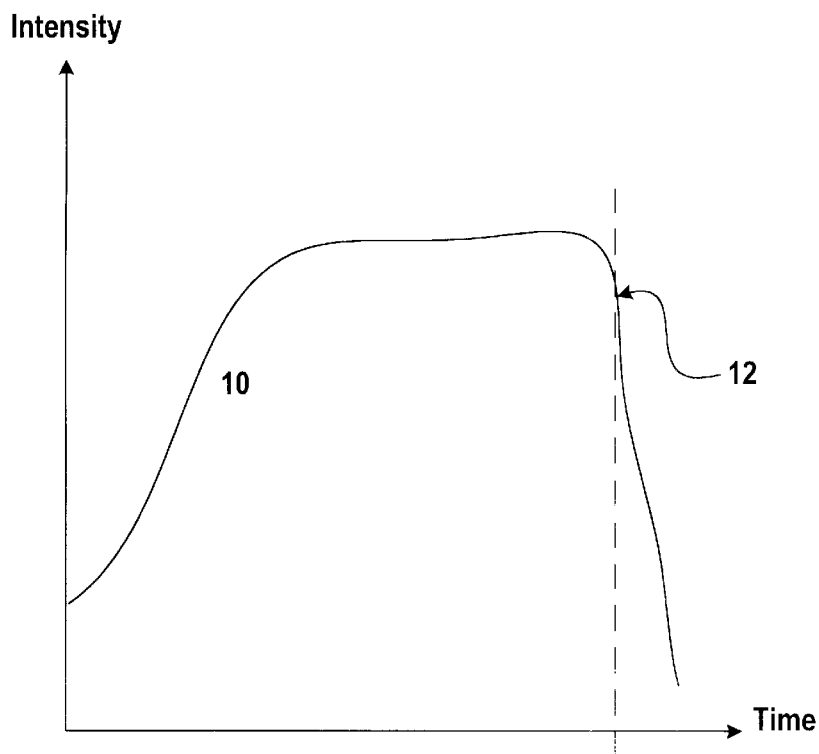
FIGS. 1 and 2 are graphical representations of end points for an etching process.
Figure 2:
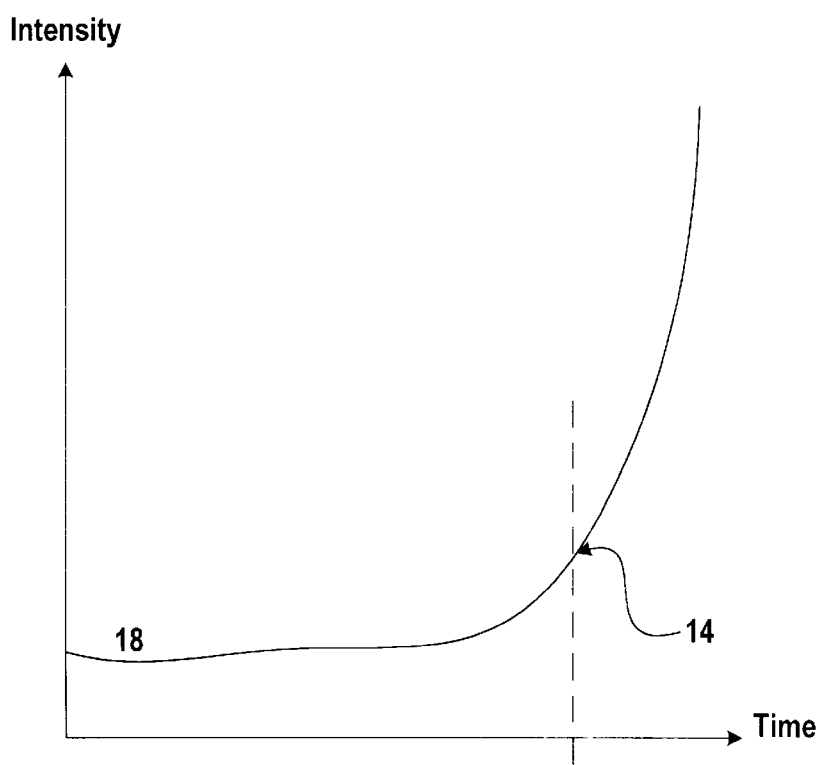

FIG. 2 depicts an alternate type of end point detection according to the present invention. As depicted in FIG. 2, the emission intensity level at a targeted wavelength suddenly increases appreciably. A spectral event such as this tends to indicate that there is an appreciable amount of a new species in the plasma. This tends to occur when an overlying layer has been substantially etched away, and an underlying layer of a different material is started to be etched and introduced into the plasma. Thus, both of the spectral events as depicted in FIGS. 1 and 2 are preferably detected as an end point to various etching processes that are performed in an etcher according to the present invention.

Figure 3:
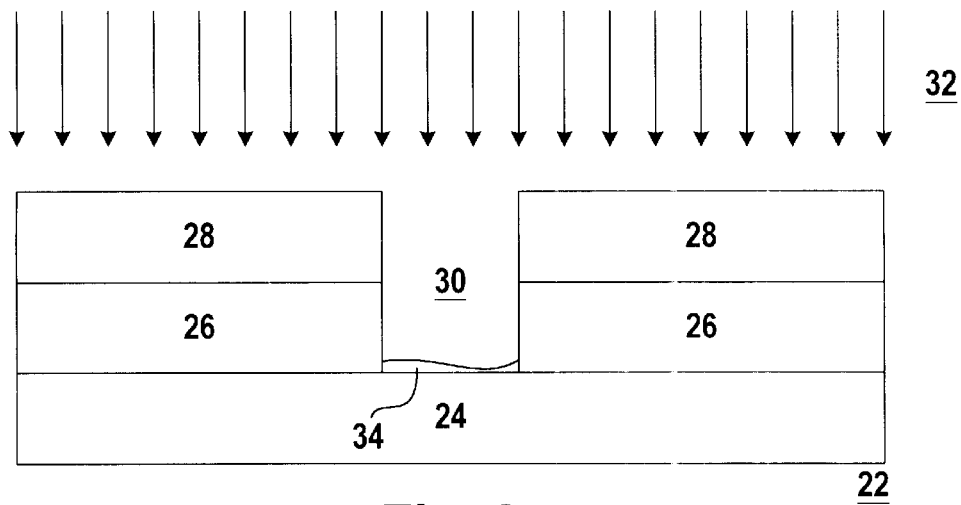
FIG. 3 is a cross sectional view of a substrate to be etched.

A representative substrate 22 is illustrated in cross-sectional view in FIG. 3. The substrate 22 includes a silicon oxide layer 24, a metal layer 26, and a photoresist layer 28. In the example depicted and described herein, the photoresist layer 28 is applied and patterned to provide masking to the metal layer 26 during the etching process, so that preferably only the metal layer 26 in opening 30 is etched by the plasma 32 generated in the plasma etching chamber. During the etching process, various materials are released from the substrate 22 and ionized in the plasma in the etching chamber. These materials are preferably monitored by detecting the intensity of the emissions at one or more predetermined wavelengths or range of wavelengths.

When etching the metal layer 26 in the opening 30, there are preferably species from the photoresist layer 28 and the metal layer 26 present in the plasma, which species generate emissions at known wavelengths. As the metal layer 26 is etched away in the opening 30, the silicon oxide layer 24 is exposed, and new species are introduced into the plasma. The new species preferably generate emissions at known wavelengths that are different from the emissions and wavelengths of the species from the photoresist layer 28 and the metal layer 26. Thus, by monitoring for the presence of the species from the silicon oxide layer 24, a spectral event such as depicted in FIG. 2 is preferably observed.

In the preferred situation, all of the metal layer 26 in opening 30 is removed down to the silicon oxide layer 24. However, improper detection of the end point of the etching process may leave a small amount 34 of the metal layer 26 in the opening 30. Alternately, improper detection of the end point may etch the silicon oxide layer 24 to an undesirable degree in the opening 30. Accordingly, it is important to properly detect the end point of the etching process for uniform processing of substrates 22.

Figure 4:
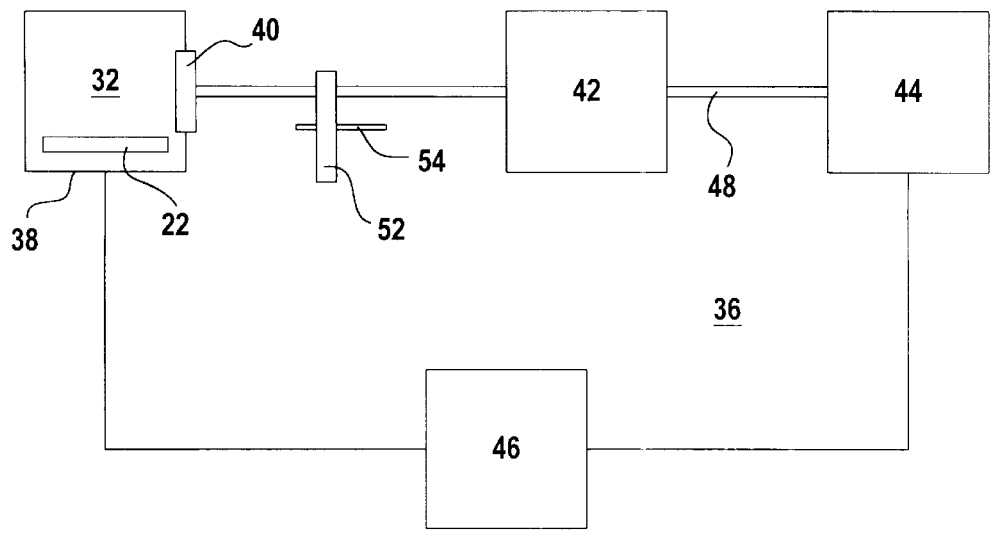
FIG. 4 is a functional schematic of a first embodiment of an etching system according to the present invention.

A preferred etching system 36 is illustrated in the functional schematic view in FIG. 4. The etching system 36 preferably includes an etching chamber 38, a window 40, a emission wavelength filter 42, an emission intensity level detector 44, and controller 46. The window 40 may be the side of a transparent walled etching chamber 38 or a special view port for the etching chamber 38. The controller 46 preferably includes an analyzer for detecting the spectral events, such as exemplified in FIGS. 1 and 2. The controller 46 also preferably controls the etching process conducted in the etching chamber 38. For example, the controller 46 preferably controls the gases, times, pressures, temperatures, powers, and other variables that may desirably be controlled during the etching process. The control points for these process variables are unitedly referred to as a process recipe.

It is desirable to use the same process recipe for all etching systems 36 that run the same etching process, and further, the use the same process recipe for a given etching system 36 over time. However, the differences between etching systems 36 and the differences in a given etching system 36 over time has tended to make this impractical, as described above.

During the etching process, the plasma 32 in the etching chamber 26 etches the substrate 22. The etching chamber 38 may be a plasma etcher, a reactive ion etcher, an asher, or any other such etching device. Spectral emissions of electromagnetic radiation from the etching process are transmitted through the window 40 along an emissions path 48 to the wavelength filter 42. The window 40 is preferably a quartz window which is resistant to the etching process in the etching chamber 38.

The wavelength filter 42 preferably removes undesired emission frequencies, such as may be generated by the plasma discharge or ambient lighting, so that one or more predetermined wavelengths or a predetermined range or wavelengths are transmitted along emissions path 48 to the emission intensity level detector 44. The predetermined wavelengths are most preferably those wavelengths that indicate the end point of the etching process. For example, when etching the metal layer 26, the predetermined wavelengths are those from the species generated by etching the silicon oxide layer 24, when looking for an end point of a spectral event such as depicted in FIG. 2, or the wavelengths from the species generated by etching the metal layer 26, when looking for an end point of a spectral event such as depicted in FIG. 1.

The emission intensity level detector 44 may be any one of a number of known detectors of optical radiation. Such detectors 44 include photo multiplier tubes and solid state radiation detectors such as diodes, photovoltaic cells and non-rectifying photo conductive materials such as cadmium sulfide.

The controller 46 preferably includes a personal computer, memory system and plasma controller for controlling the etching process. The controller 46 is coupled to the emission intensity level detector 44 and preferably analyzes the emission intensity levels over time to determine an end point in the etching process based on a change in the intensity level of the signal from the detector 44.

Also included in the etching system 36 is an emission intensity level modifier 52. The emission intensity level modifier 52 is preferably a neutral density filter for electromagnetic radiation, which is adjustable to provide variable emission intensity levels. It is preferred that the intensity modifier 52 be neutral to the wavelengths transmitted, or in other words that it attenuates the intensity level of the wavelengths and does not filter out specific wavelengths.

Figure 5:
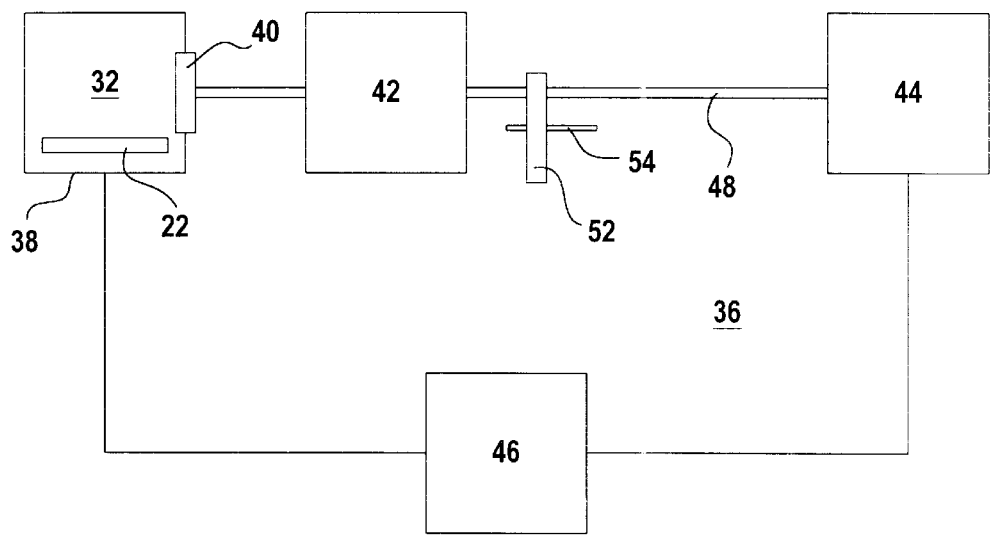
FIG. 5 is a functional schematic of a second embodiment of an etching system according to the present invention.

A preferred embodiment of the emission intensity level modifier 52 is illustrated in FIG. 4 between the etching chamber 38 and the wavelength filter 42. However, the emission intensity level modifier 52 may alternately be placed between the wavelength filter 42 and the emission intensity level detector 44, as depicted in FIG. 5. When no wavelength filter 42 is used, the emission intensity level modifier 52 is preferably placed between the etching chamber window 40 and the emission intensity level detector 44 in the emissions path 48.

Figure 6:
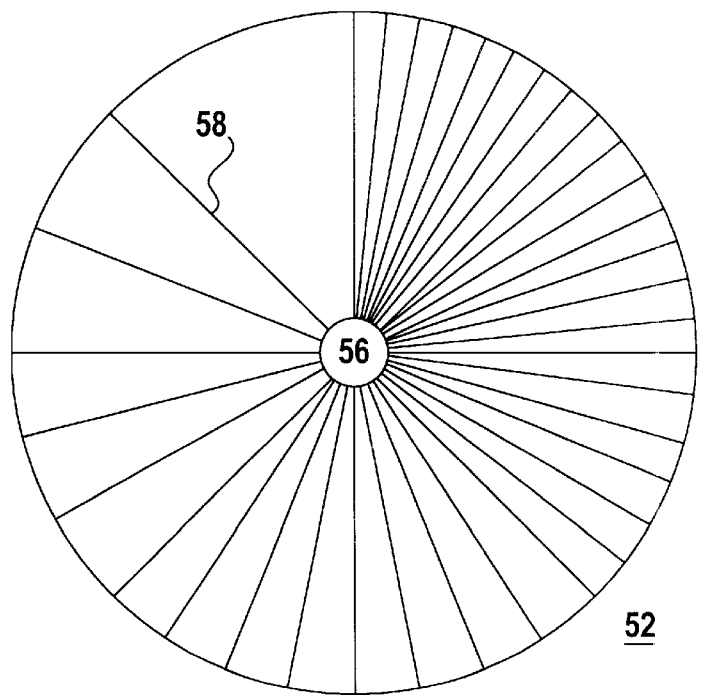
FIG. 6 is an emission intensity level modifier according to the invention.

In a particularly preferred embodiment, the emission intensity level modifier 52 has a circular configuration for rotation about an axis defined by a shaft 54 to modify the emissions, or in other words provide variable intensity of emissions as the intensity modifier 52 is rotated about the axis defined by shaft 54. A representation of the preferred emission intensity level modifier 52 is illustrated in FIG. 6. The emission intensity level modifier 52 is, in this embodiment, substantially circular and contains a central opening 56 for attaching the emission intensity level modifier 56 to the shaft 54 or for rotating the emission intensity level modifier 52 about shaft 54.

As set forth above, the intensity of emissions passing through the emission intensity level modifier 52 is adjusted by rotating the emission intensity level modifier 52 about the axis defined by the shaft 54 to reduce or increase the intensity of emissions passing through the emission intensity level modifier 52, based on the transparency or absorbance of the modifier 52, generally indicated schematically by lines 58. Closely spaced lines 58 represent lower transparency regions of the emission intensity level modifier 52 and wider spaced lines 58 represent higher transparency regions of the emission intensity level modifier 52. Accordingly, the preferred emission intensity level modifier 52 has a continuously variable transparency as the emission intensity level modifier 52 is rotated around the axis of shaft 54 for 360 degrees. Most preferably the emission intensity level modifier 52 is adjustable to pass an intensity level of the emissions that ranges from about zero percent of the raw emission intensity level to about one hundred percent of the raw emission intensity level.

Other emission intensity level modifier 52 may also be used. For example, aperture control of the cross section of light in emission path 48 entering the emission intensity level detector 44 may be used to provide a predetermined emission intensity level. Alternately, an emission intensity level modifier 52 that is shaped in a strip, rather than a circle, may be used, where the degree of transmission ranges from about zero percent of the raw emission intensity level at one end of the strip to about one hundred percent of the raw emission intensity level at the other end of the strip. It is appreciated that many other configurations of the emission intensity level modifier 52 may also be used, and that the invention is not to be limited to the exact configuration of the emission intensity level modifier 52.

The invention enables consistent end point detection from etching chamber to etching chamber and from batch to batch of substrate etching for the same etching process. With the emission intensity level modifier 52 selected with the greatest intensity transmission, the emission intensity level is preferably determined for different etching systems 36 that are used for processing similar substrates. The emission intensity is preferably read at the onset of the etching process, such as in a relatively stable portion of the curve depicted in FIG. 2. The lowest emission intensity level from multiple etching systems 36 is then determined, and the lowest emission intensity is multiplied by a factor, preferably of less than about one, to provide a target emissions intensity value.

The target emissions intensity value preferably represents a base line for the start of the etching process that is consistent for all of the different etching systems 36. Emission intensity level modifier 52 for each of the etching systems 36 are then adjusted so that the emission intensity level detector 44 for each of the etching systems 36 reads the target emissions intensity level value. This procedure is most preferably accomplished at a time when the etching chambers 38 have been used for a complete duty cycle, and are just about to be cleaned. Thus, the target emission intensity level value preferably represents the lowest emission intensity level that is typically expected from any of the various etching systems 36 at any point in time.

When the transparency of the window 40 increases, such as when it is cleaned, the emission intensity level modifier 52 is adjusted to reduce the intensity level of the emissions to a detected value of the target emission intensity level. Then as the transparency of the window decreases over time during a complete duty cycle, between cleaning cycles of the etching chamber 38, the effective emission intensity level from the etching chamber 38 is attenuated to the target emission intensity level by adjusting the emission intensity level modifier 52 about the axis defined by shaft 54 to a position in which more of the emissions are transmitted through the emission intensity level modifier 52 to the emission intensity level detector 44.

In this manner, the baseline emission intensity level as detected by the emission intensity level detector 44 at the beginning of an etch process is preferably held relatively constant over time, and is also held at a relatively consistent baseline from etching system to etching system. In this manner, the same recipe is preferably run on the controller 46 for each of the various etching systems 36 over time, and a consistent end point is determined for each of the etching systems 36 over time.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for detecting an end point of an etching step conducted in an etching chamber, the method comprising:

selecting a target emission intensity level for the etching step, performing the etching step in the etching chamber, sensing a raw emission intensity level from the etching chamber during the etching step with an emission intensity level detector, modifying the raw emission intensity level sensed from the etching chamber by the emission detector with an emission intensity level modifier, adjusting the raw emission intensity level sensed with the emission intensity level detector from the etching chamber during the etching step to the target emission intensity level by adjusting the emission intensity level modifier, and stopping the etching process upon occurrence of a spectral event sensed by the emission intensity level detector.

2. The method of claim 1, wherein the step of selecting a target emission intensity level for the etching step comprises:

sensing a raw emission intensity level for a plurality of etching chambers, determining a lowest raw emission intensity level sensed from the plurality of etching chambers, multiplying the lowest raw emission intensity level sensed from the plurality of etching chambers by an intensity factor to produce a result, and selecting the result as the target emission intensity level for the etching step in each of the plurality of etching chambers.

3. The method of claim 2, wherein the intensity factor is less than one.

4. The method of claim 2, wherein the step of sensing a raw emission intensity level for a plurality of etching chambers is performed after each of the plurality of etching chambers has been used for a complete duty cycle and just prior to a scheduled cleaning for each of the plurality of etching chambers.

5. The method of claim 1 wherein the emission intensity level modifier comprises a graduated neutral density filter.

6. The method of claim 1 wherein emissions from the etching chamber are filtered by a wavelength filter to a target wavelength range before being sensed by the emission intensity level detector.

7. The method of claim 6 wherein the emission intensity level modifier is disposed between the wavelength filter and the emission intensity level detector.

8. The method of claim 6 wherein the emission intensity level modifier is disposed between the etching chamber and the wavelength filter.

9. The method of claim 6 wherein the wavelength filter comprises an optical band pass filter.

10. The method of claim 6 wherein the wavelength filter comprises a monochromater.

11. The method of claim 1 wherein the spectral event comprises a rapid rise in sensed emission intensity level above the target emission intensity level in a target wavelength range.

12. The method of claim 1 wherein the spectral event comprises a rapid decrease in sensed emission intensity level below the target emission intensity level in a target wavelength range.

13. The method of claim 1 wherein the etching chamber further comprises a plasma etcher.

14. The method of claim 1 wherein the etching chamber further comprises a reactive ion etcher.

15. An etcher comprising:

an etching chamber for etching a substrate with an etching process, an emission intensity level detector for detecting emissions generated while etching the substrate, an emission intensity level modifier for modifying the emissions detected by the emission intensity level detector and substantially maintaining a target emission intensity level at an onset of the etching process, and an analyzer for stopping the etching process upon occurrence of a spectral event sensed by the emission intensity level detector through the emission intensity level modifier.

16. The etcher of claim 15 further comprising a wavelength filter disposed between the etching chamber and the emission intensity level detector, the wavelength filter for selecting a wavelength range for detection by the emission intensity level detector.

17. The etcher of claim 16 wherein the wavelength filter is disposed between the etching chamber and the emission intensity level modifier.

18. The etcher of claim 16 wherein the wavelength filter is disposed between the emission intensity level modifier and the emission intensity level detector.

19. An end point detector for detecting an end point of an etching process of a substrate that is conducted in an etching chamber, the end point detector comprising:

an emission intensity level detector for detecting emissions generated while etching the substrate during the etching process, an emission intensity level modifier for modifying the emissions detected by the emission intensity level detector and substantially maintaining a target emission intensity level at an onset of the etching process, and an analyzer for stopping the etching process upon occurrence of a spectral event sensed by the emission intensity level detector through the emission intensity level modifier.

20. The end point detector of claim 19 further comprising a wavelength filter for selecting a wavelength range for detection by the emission intensity level detector.

* * * * *